(12) United States Patent
Patel et al.

(10) Patent No.: US 6,586,814 B1
(45) Date of Patent: Jul. 1, 2003

(54) ETCH RESISTANT SHALLOW TRENCH ISOLATION IN A SEMICONDUCTOR WAFER

(75) Inventors: Rajiv Patel, San Jose, CA (US); David Chan, San Jose, CA (US); Arvind Kamath, Mountain View, CA (US); Ken Rafftesaeth, San Jose, CA (US); Venkatesh P. Gopinath, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/735,084

(22) Filed: Dec. 11, 2000

(51) Int. Cl.⁷ ................................................ H01L 29/00
(52) U.S. Cl. ........................ 257/506; 257/510; 438/221; 438/296; 438/424
(58) Field of Search ................................. 438/221, 296, 438/426, 424, 437; 257/506, 510

(56) References Cited

U.S. PATENT DOCUMENTS

| | | | |
|---|---|---|---|
| 5,399,520 A | 3/1995 | Jang | 438/445 |
| 5,512,509 A | 4/1996 | Han | 438/446 |
| 5,665,635 A | 9/1997 | Kwon et al. | 438/427 |
| 5,681,776 A | 10/1997 | Hebert et al. | 438/442 |
| 6,114,218 A | 9/2000 | Jeng | 438/427 |
| 6,153,261 A * | 11/2000 | Xia | 427/255.393 |
| 6,184,127 B1 * | 2/2001 | Doan et al. | 438/637 |
| 6,218,267 B1 * | 4/2001 | Liu | 438/431 |
| 6,391,710 B1 * | 5/2002 | Moore et al. | 438/253 |

FOREIGN PATENT DOCUMENTS

| | | |
|---|---|---|
| JP | 62-014439 | 1/1987 |
| JP | 01-282839 | 11/1989 |

* cited by examiner

Primary Examiner—Olik Chaudhuri
Assistant Examiner—Hsien-Ming Lee
(74) Attorney, Agent, or Firm—John R. Ley, LLC

(57) ABSTRACT

A shallow isolating trench is formed in a semiconductor wafer between active component areas to electrically isolate the active components from each other. The isolating trench is primarily formed of an insulating material, such as an oxide, in a recess formed into the wafer. An etch resistant material, such as BTBAS nitride, is placed over the insulating material in the recess. The etch resistant material protects the insulating material from erosion due to subsequent semiconductor fabrication process steps, so the integrity of the isolating trench and the planarity of the wafer are generally maintained.

11 Claims, 3 Drawing Sheets

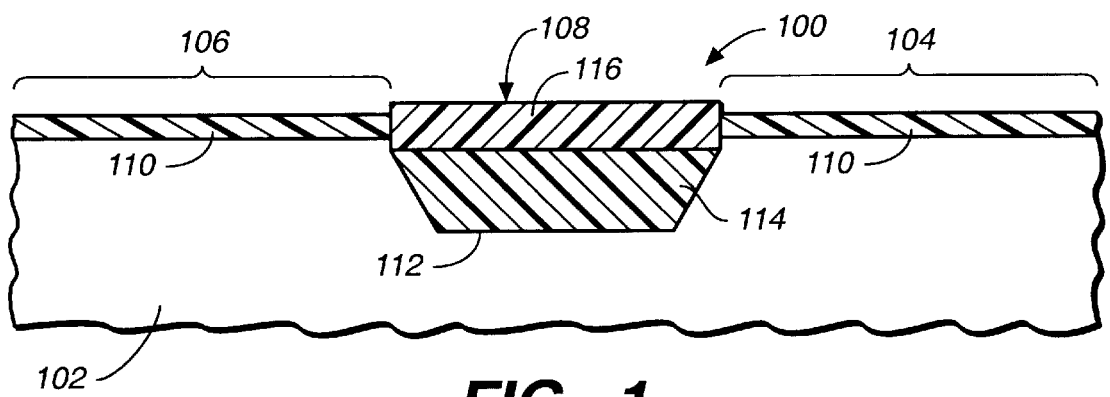
FIG._1
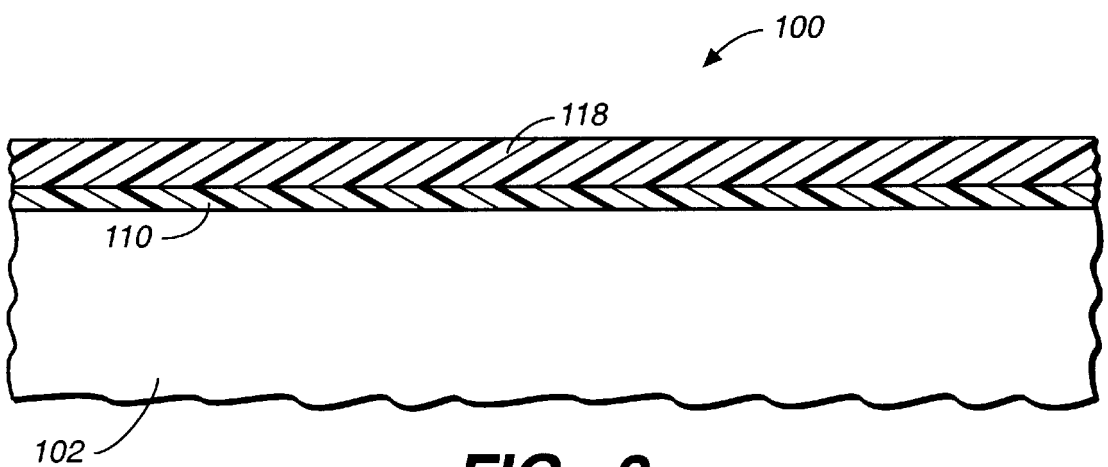
FIG._2
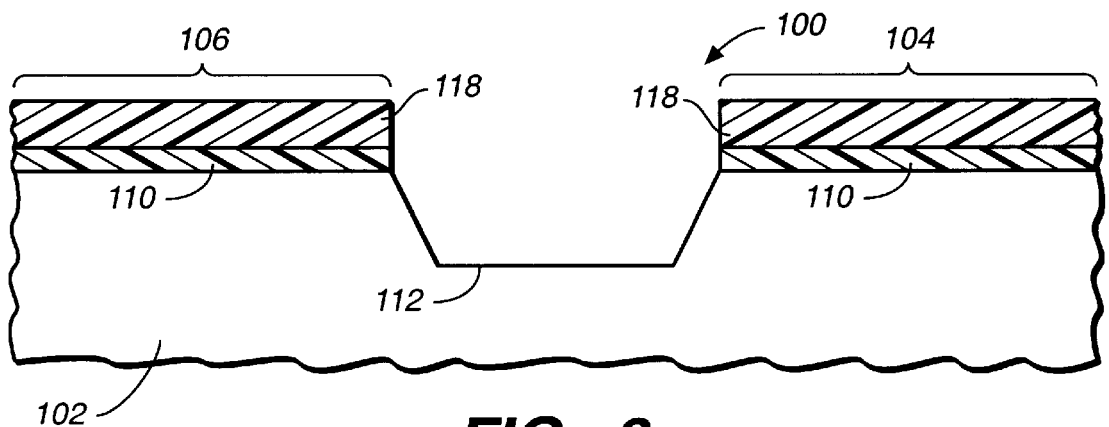
FIG._3

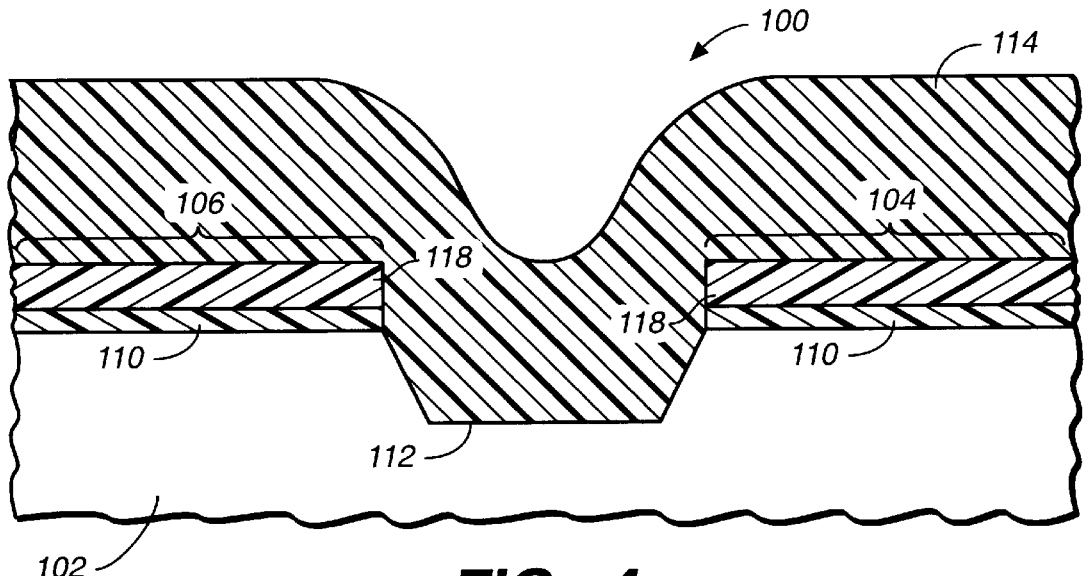
FIG._4
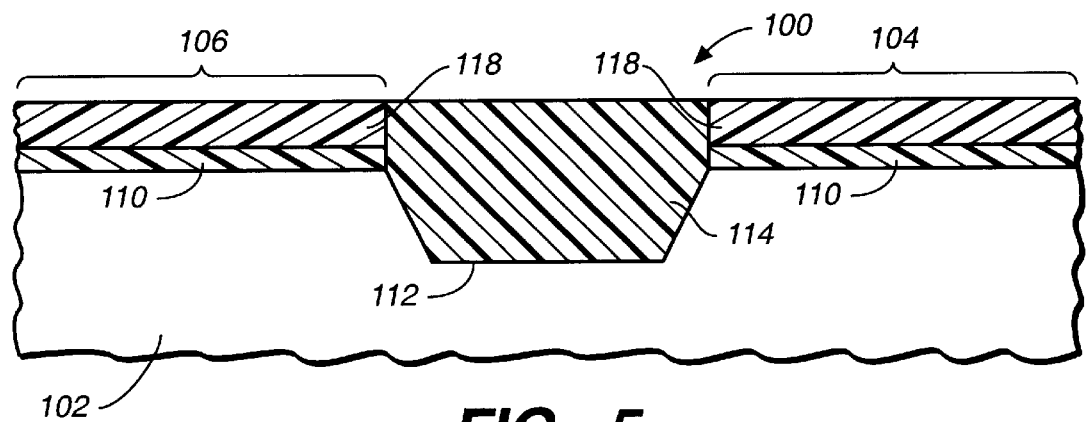
FIG._5
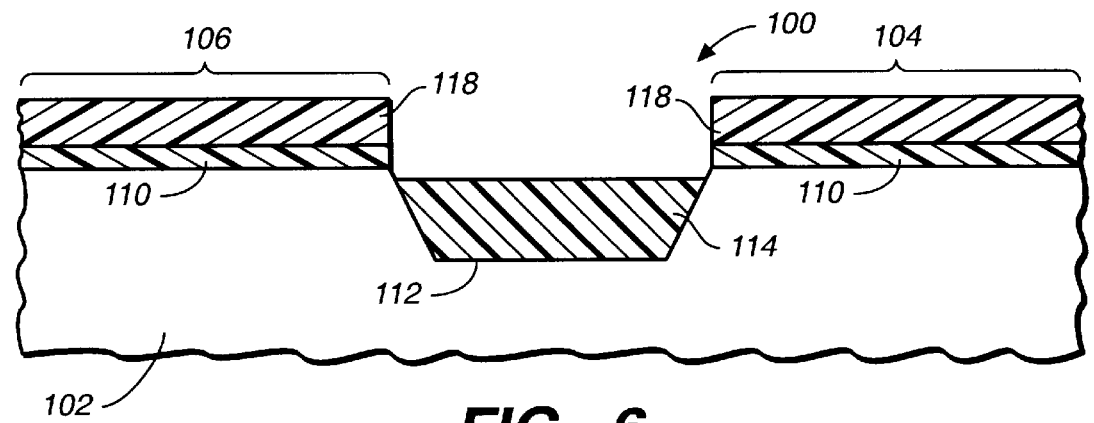
FIG._6

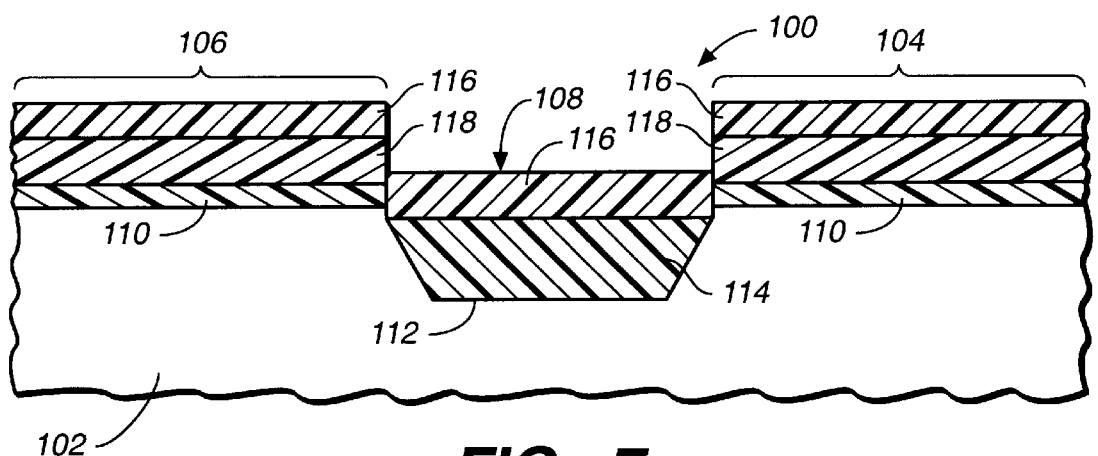
FIG._7
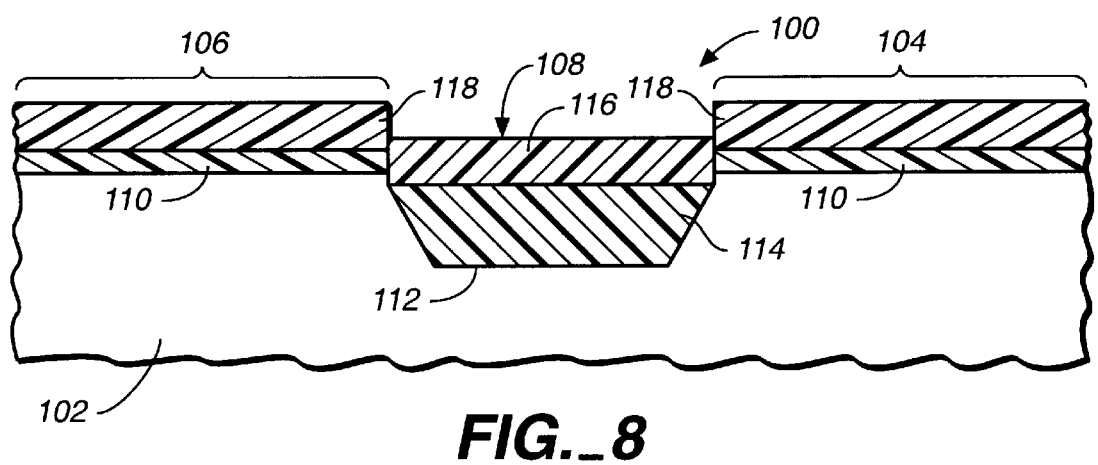
FIG._8

ETCH RESISTANT SHALLOW TRENCH ISOLATION IN A SEMICONDUCTOR WAFER

FIELD OF THE INVENTION

This invention relates to semiconductor wafer processing. More particularly, the present invention relates to a new and improved way to form a shallow trench for isolating active components in an integrated circuit chip in a semiconductor wafer. Eroding or etching away of the shallow trench during subsequent processing is prevented, so the integrity of the shallow trench and the planarity of the semiconductor wafer are maintained.

BACKGROUND OF THE INVENTION

In the fabrication of integrated circuit (IC) chips on a semiconductor wafer, particularly for current advanced devices, it is often necessary to form shallow isolating trenches for insulation barriers between active components in the silicon of the IC to isolate the active components from each other and prevent electrical interference between the active components. Typically, a trench is formed between adjoining active areas to a predetermined depth in the silicon. The trench is filled with an insulating material, such as silicon oxide.

The silicon oxide (a.k.a. the oxide) is typically deposited across the wafer in either a chemical vapor deposition (CVD) or plasma enhanced chemical vapor deposition (PECVD) process into the trench and onto the higher formations outside the trench. Then a chemical mechanical polishing (CMP) process is performed to remove the oxide from the formations outside the trench and to achieve a smooth uniform surface across the wafer. At this point, the isolating trench is completed, but exposed.

Various subsequent process steps typically use hydrofluoric acid (HF) or phosphoric acid to etch away or remove certain materials from the active areas. A certain amount of the exposed oxide in the trench, however, is usually also removed or eroded in these steps. In fact, deposited oxide typically etches at a faster rate than does thermally grown oxide, which is commonly formed in the active areas of the wafer outside the trench. The deposited oxide etches faster because it is typically not as dense as the thermally grown oxide. Additionally, if there has been an implant step (e.g. implanting nitrogen in portions of the wafer), then the deposited oxide may have been damaged by the implant step, and the damaged oxide will etch even faster. Therefore, the oxide in the trench typically etches away faster than the oxide outside the trench.

If too much of the oxide in the trench is etched away, then the planarity (e.g. smoothness or uniformity) of the surface of the wafer that was obtained through the CMP process may be lost. Proper planarity, however, is important for forming a pattern or image on the surface of the wafer, etching subsequent layers that are placed onto the wafer and other processing steps. Additionally, if silicon is deposited over the trench after a portion of the oxide in the trench has been eroded away, then a leakage pathway between active areas may accidentally be established over the trench. Therefore, HF and phosphoric acid etching steps and any other processing steps that may erode exposed portions of the oxide in the trench must be very rigorously controlled, so that an excessive amount of the oxide in the trench is not removed. Such rigorous control can be difficult to achieve.

It is with respect to these and other background considerations that the present invention has evolved.

SUMMARY OF THE INVENTION

The present invention prevents erosion or removal of the oxide in the shallow isolating trench between active areas of the semiconductor wafer by placing a layer of material, such as BTBAS (Bis-Tertiary-Butyl-Amino-Silane) nitride, which will not be substantially affected by the chemicals used in subsequent processing steps, onto the oxide in the trench. Since the etch rate of BTBAS nitride, or other appropriate etch resistant material, in HF or phosphoric acid is negligible, the processing steps that follow the placement of the BTBAS nitride over the oxide in the trench can be performed in a conventional manner without affecting the oxide in the trench.

These and other improvements are achieved by forming an isolating trench between active areas in a semiconductor substrate. A recess is formed for the isolating trench in the top of the substrate. Insulating material, such as a deposited oxide, is placed in the recess. An etch resistant material, preferably BTBAS nitride, is placed in a thin layer onto the insulating material in the recess. In this manner, the insulating material is protected from subsequent HF and phosphoric acid etch processes by the etch resistant material. Thus, when the substrate is exposed to such an etch substance, portions outside the isolating trench will be etched, while the etch resistant material and the insulating material will be left substantially intact.

To accomplish the process, the insulating material is preferably placed across the entire substrate, including inside the recess and outside the recess. A CMP step typically removes the insulating material from all regions outside the recess. Then an etch step preferably removes some of the insulating material from within the recess down to a predetermined height. The etch resistant material is then preferably placed across the entire substrate, including inside the recess on top of the reduced-height insulating material and outside the recess on top of the active areas. Another CMP step then removes the etch resistant material from regions outside the insulating material.

The previously mentioned and other improvements are also achieved in an improved isolating trench for electrically isolating adjacent active areas in a semiconductor substrate. The isolating trench includes a recess in the silicon substrate between the active areas, an insulating material disposed in the recess and an etch resistant material, preferably BTBAS nitride, overlaying the insulating material. The recess in the silicon substrate extends to a predetermined depth. The insulating material extends in the recess up to a predetermined height to form a primary electrically isolating portion of the isolating trench to prevent electrical interference between the active areas. Additionally, the insulating material is reactive with certain etch substances, such as HF and phosphoric acid. The etch resistant material, on the other hand, is unreactive with the same etch substances, so that the etch resistant material can protect the insulating material when the semiconductor substrate is exposed to the etch substances during the etching of portions of the active areas.

A more complete appreciation of the present invention and its scope, and the manner in which it achieves the above noted improvements, can be obtained by reference to the following detailed description of presently preferred embodiments of the invention taken in connection with the accompanying drawings, which are briefly summarized below, and the appended claims.

BRIEF DESCRIPTION OF THE DRAWINGS

FIG. 1 is a cross sectional view of an isolating trench in a substrate of a semiconductor wafer, which incorporates the present invention.

FIGS. 2–8 are cross sectional views of stages of the steps to form the isolating trench shown in FIG. 1.

DETAILED DESCRIPTION

A semiconductor wafer 100, as shown in FIG. 1, includes a silicon substrate 102 with electrically active regions 104 and 106 separated by a shallow isolating trench 108. The active areas 104 and 106 typically have active circuit components (not shown) that are part of an overall integrated circuit (IC) (not shown). Such active circuit components typically include transistors, capacitors and other circuit elements formed closely together. The close proximity of the active circuit components to each other would result in current leaking from one component to another if not for the isolating trench 108 in between the active areas 104 and 106.

An insulating oxide layer 110 is typically formed on top of the silicon of the substrate 102, and the isolating trench 108 is formed in a recess 112 formed through the oxide layer 110 and into the silicon of the substrate 102. The isolating trench 108 includes a deposited oxide layer 114 and a layer 116 of BTBAS (Bis-Tertiary-Butyl-Amino-Silane) nitride or other appropriate etch resistant material. The oxide layer 114 is deposited into the recess 112 and serves as the primary isolating portion of the isolating trench 108. The BTBAS layer 116 is placed on top of the oxide layer 114 before further fabrication processes are performed on the active areas 104 and 106. The etch resistant material of the layer 116 is preferably BTBAS nitride, but may also be silicon oxynitride, aluminum oxide or other material that is not sensitive to or reactive with the chemicals used in the subsequent fabrication processes to form structures in the active areas 104 and 106.

Some of the subsequent fabrication processes commonly use hydrofluoric acid (HF) or phosphoric acid during etch steps. The material of the deposited oxide layer 114 is typically sensitive to or reactive with HF and phosphoric acid, so the oxide layer 114 would be partially eroded away if not for the BTBAS layer 116. The etch rate of BTBAS nitride in HF and phosphoric acid under conventional processing conditions is almost negligible. Therefore, the BTBAS layer 116 protects the deposited oxide layer 114 from erosion during subsequent etch processes.

The process steps for forming the isolating trench 108 (FIG. 1) start with the substrate 102 having the oxide layer 110 formed thereon and a silicon nitride layer 118 (e.g. about 1000 to 1500 angstroms thick) formed on top of the oxide layer 110, as shown in FIG. 2. Later, after formation of the isolating trench 108 (FIG. 1), the oxide and nitride layers 110 and 118 will be selectively etched away with the HF or phosphoric acid in the active areas 104 and 106 (FIG. 1) to form the active circuit components (not shown) in the silicon of the substrate 102.

To etch away the recess 112 (FIG. 1), a photoresist mask (not shown) is placed on top of the nitride layer 118 and patterned with an image of the isolating trench 108 (FIG. 1), so the surface of the nitride layer 118 is exposed in the desired pattern. The recess 112, as shown in FIG. 3, is then formed between the active areas 104 and 106 by etching through the exposed nitride layer 118 and the oxide layer 110 and partially into the substrate 102.

The surface of the wafer 100 is covered with the deposited oxide layer 114, as shown in FIG. 4, by an oxide CVD or PECVD process. The oxide layer 114 also fills in the recess 112.

A chemical mechanical polish (CMP) step removes the oxide layer 114 from regions outside the recess 112, including the surface of the active areas 104 and 106. The CMP step leaves a smooth surface at the level of the top of the nitride layer 118, as shown in FIG. 5.

A light HF etch or "dip" step (e.g. a 10:1 HF concentration in the HF dip) removes a top portion of the oxide layer 114 (FIG. 5) from within the recess 112, as shown in FIG. 6. The remainder of the oxide layer 114 is disposed in the recess 112 extending from the bottom of the recess 112 up to the preferred height for the deposited oxide layer 114.

The BTBAS nitride layer 116 (e.g. 500 angstroms) is deposited across the surface of the wafer 100, as shown in FIG. 7. The BTBAS nitride layer 116 covers the deposited oxide layer 114 in the recess 112 and the nitride layer 118 in the active areas 104 and 106. The isolating trench 108 is thus completed, but additional steps are typically performed to remove or clean away unneeded portions of the surrounding formations.

Another CMP process is used to remove the BTBAS nitride layer 116 from the top of the nitride layer 118 in the active areas 104 and 106. The BTBAS nitride layer 116, thus, remains only on top of the deposited oxide layer 114 in the recess 112, as shown in FIG. 8.

A hot phosphoric acid etch then removes the nitride layer 118 from the active areas 104 and 106, leaving the isolating trench 108 surrounded by the oxide layer 110 over the silicon of the substrate 102 in the active areas 104 and 106, as shown in FIG. 1. A small, almost negligible, amount of the BTBAS nitride layer 116 of the isolating trench 108 may be removed by the phosphoric acid. The oxide layer 110, however, is relatively unaffected by the phosphoric acid.

Although some small amount of the BTBAS nitride layer 116 of the isolating trench 108 is typically eroded away in some of the steps during the subsequent conventional fabrication processes that form the active circuit components (not shown) in the active areas 104 and 106, at least some of the BTBAS nitride layer 116 remains to protect the deposited oxide layer 114. In this manner, the BTBAS nitride layer 116 generally maintains the planarity of the surface of the semiconductor wafer 100, so the invention has the advantage of maintaining the integrity of the isolating trench 108 and the planarity of the semiconductor wafer 100 by protecting the insulating material 114 from erosion during the subsequent process steps.

Presently preferred embodiments of the invention and its improvements have been described with a degree of particularity. This description has been made by way of preferred example. It should be understood that the scope of the present invention is defined by the following claims, and should not be unnecessarily limited by the detailed description of the preferred embodiments set forth above.

The invention claimed is:

1. A method for forming an isolating trench between active areas in a semiconductor substrate comprising the steps of:

providing a semiconductor substrate having a top surface and at least two regions for active areas;

forming a recess for the isolating trench in the top surface of the semiconductor substrate between the two regions;

placing an insulating material into the recess to form a primary portion of the isolating trench between the two regions; and placing a Bis-Tertiary-Butyl-Amino-Silane nitride layer that is etch resistant to a hot phosphoric acid etch over the insulating material of the isolating trench.

2. A method as defined in claim 1 comprising the further steps of:
exposing the semiconductor substrate to a hot phosphoric acid etch substance; and
etching a portion of the semiconductor substrate in the two regions for the active areas without substantially removing the Bis-Tertiary-Butyl-Amino-Silane nitride layer.

3. A method as defined in claim 1 comprising the further steps of:
placing the Bis-Tertiary-Butyl-Amino-Silane nitride layer across the top of the semiconductor substrate and into the recess on top of the insulating material inside the recess; and
removing the Bis-Tertiary-Butyl-Amino-Silane nitride layer from the top of the semiconductor substrate outside the recess.

4. A method as defined in claim 1 comprising the further steps of:
placing the insulating material across the top surface of the semiconductor substrate and into the recess after forming the recess for the isolating trench; and
removing the insulating material from the top surface of the semiconductor substrate outside the recess prior to placing the Bis-Tertiary-Butyl-Amino-Silane nitride layer over the insulating material.

5. A method as defined in claim 4 comprising the further steps of:
removing a portion of the insulating material from the recess down to a height in the recess; and
placing the Bis-Tertiary-Butyl-Amino-Silane nitride layer on top of the insulating material inside the recess after the portion of the insulating material has been removed.

6. A method as defined in claim 5 comprising the further steps of:
placing the Bis-Tertiary-Butyl-Amino-Silane nitride layer across the top of the semiconductor substrate and into the recess on the top of the insulating material inside the recess after the portion of the insulating material has been removed;
removing the Bis-Tertiary-Butyl-Amino-Silane nitride layer from the top of the semiconductor substrate outside the recess.

7. A method as defined in claim 1 comprising the further steps of:
forming an oxide layer on the top surface of the semiconductor substrate;
forming a nitride layer on top of the oxide layer; and
forming the recess through the nitride layer, through the oxide layer and into the semiconductor substrate.

8. A method as defined in claim 7 comprising the further steps of:
placing the insulating material on top of the nitride layer and into the recess;
removing the insulating material from the top of the nitride layer outside the recess; and
removing a portion of the insulating material from the recess down to a height in the recess.

9. A method as defined in claim 8 comprising the further steps of:
placing the Bis-Tertiary-Butyl-Amino-Silane nitride layer on the top of the nitride layer and into the recess and on top of the insulating material inside the recess;
removing the Bis-Tertiary-Butyl-Amino-Silane nitride layer from the top of the nitride layer outside the recess; and
removing the nitride layer.

10. A method as defined in claim 1 comprising the further step of:
placing an oxide material to a height into the recess to form the primary portion of the isolating trench between the two regions.

11. An electrically isolating trench between electrically active areas of an integrated circuit formed in a semiconductor substrate by steps including an application of a hot phosphoric acid etch substance comprising:
a recess formed between the active areas in the semiconductor substrate;
an insulating material disposed in the recess to form a primary portion of the isolating trench, the insulating material being substantially reactive with the hot phosphoric acid etch substance and substantially preventing electrical interference between the active areas; and
a Bis-Tertiary-Butyl-Amino-Silane nitride etch resistant material overlaying the insulating material and being substantially unreactive with the hot phosphoric acid etch substance.

* * * * *